US009391427B2

(12) United States Patent
Eid et al.

(10) Patent No.: US 9,391,427 B2
(45) Date of Patent: Jul. 12, 2016

(54) THERMAL MANAGEMENT IN PACKAGED VCSELS

(75) Inventors: Feras Eid, Chandler, AZ (US); Shawna M. Liff, Scottsdale, AZ (US); Henning Braunisch, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/698,453

(22) PCT Filed: Nov. 18, 2011

(86) PCT No.: PCT/US2011/061423
§ 371 (c)(1),
(2), (4) Date: Jul. 11, 2014

(87) PCT Pub. No.: WO2013/074122
PCT Pub. Date: May 23, 2013

(65) Prior Publication Data
US 2014/0314111 A1    Oct. 23, 2014

(51) Int. Cl.
*H01S 5/024* (2006.01)
*H01S 5/022* (2006.01)
*H01S 5/183* (2006.01)
*H01S 5/42* (2006.01)

(52) U.S. Cl.
CPC ......... *H01S 5/02476* (2013.01); *H01S 5/02236* (2013.01); *H01S 5/183* (2013.01); *H01S 5/423* (2013.01)

(58) Field of Classification Search
CPC . H01S 5/02236; H01S 5/02476; H01S 5/183; H01S 5/423; H01S 5/02469
See application file for complete search history.

(56) References Cited

U.S. PATENT DOCUMENTS 5,796,714 A * 8/1998 Chino et al. ............. 372/50.124
7,068,892 B1    6/2006 Lu et al.
(Continued)

FOREIGN PATENT DOCUMENTS

JP    2005-032937 A    2/2005
JP    2007-012979 A    1/2007
(Continued)

OTHER PUBLICATIONS

International Search Report and Written Opinion Received for PCT Application No. PCT/US2011/061423, Mailed on Aug. 27, 2012, 9 pages.
(Continued)

*Primary Examiner* — Yuanda Zhang
*Assistant Examiner* — Michael Carter
(74) *Attorney, Agent, or Firm* — Schwabe, Williamson & Wyatt, P.C.

(57) ABSTRACT

Heat management systems for vertical cavity surface emitting laser (VCSEL) chips are provided. Embodiments of the invention provide substrates having a vertical cavity surface emitting laser chip disposed on the substrate surface and electrically interconnected with the substrate, a thermal frame disposed on the substrate surface and proximate to at least three sides of the vertical cavity surface emitting laser chip, and a thermal interface material disposed between the at least three sides of the vertical cavity surface emitting laser chip and the thermal frame. The substrate can also include a transceiver chip that is operably coupled to a further integrated circuit chip and that is capable of driving the VCSEL chip.

22 Claims, 9 Drawing Sheets

(56) References Cited

U.S. PATENT DOCUMENTS

| | | | |
|---|---|---|---|
| 7,183,658 B2* | 2/2007 | Towle et al. | 257/784 |
| 7,236,666 B2 | 6/2007 | Towle et al. | |
| 7,283,699 B2 | 10/2007 | Lu et al. | |
| 7,344,318 B2 | 3/2008 | Lu et al. | |
| 7,344,383 B1 | 3/2008 | Lu et al. | |
| 7,646,093 B2 | 1/2010 | Braunisch et al. | |
| 7,684,660 B2 | 3/2010 | Braunisch et al. | |
| 7,703,991 B2 | 4/2010 | Lu et al. | |
| 7,705,447 B2 | 4/2010 | Ganesan et al. | |
| 7,720,337 B2 | 5/2010 | Lu et al. | |
| 8,227,904 B2 | 7/2012 | Braunisch et al. | |
| 8,230,589 B2 | 7/2012 | Lu et al. | |
| 2002/0015292 A1* | 2/2002 | Pritchett et al. | 361/780 |
| 2004/0126064 A1 | 7/2004 | Vandentop et al. | |
| 2005/0036728 A1 | 2/2005 | Braunisch | |
| 2011/0044369 A1* | 2/2011 | Andry et al. | 372/50.124 |
| 2011/0134947 A1* | 6/2011 | Rahum | H01S 5/0612 372/29.015 |
| 2011/0134948 A1* | 6/2011 | Kawakami | B82Y 20/00 372/34 |
| 2012/0261838 A1 | 10/2012 | Braunisch | |

FOREIGN PATENT DOCUMENTS

| | | |
|---|---|---|
| JP | 2007-201000 A | 8/2007 |
| JP | 2009-027088 A | 2/2009 |
| WO | 2013/074122 A1 | 5/2013 |

OTHER PUBLICATIONS

Mohammed, E., et al., "Optical Hybrid Package with an 8-Channel 18GT/s CMOS Transceiver for Chip-to-Chip Optical Interconnect," Proceedings of SPIE, Photonics Packaging, Integration, and Interconnects VIII, (2008) 6899.

Childers, Eric, et al., "Miniature Detachable Photonic Turn Connector for Optical Module Interface," IEEE 2011 Electronic Components and Technology Conference, (2011) 1922.

Benner, Alan F., et al., "Optics for High-Performance Servers and Supercomputers," Optical Fiber Communication (OFC), collocated National Fiber Optic Engineers Conference, 2010 Conference on (OFC/NFOEC), (Mar. 21-25, 2010) 1-3.

Ogura, Kouhei, et al., "Polysilane-based 3D Waveguides for Optical Interconnects," SPIE Proceedings, (Feb. 12, 2008), vol. 6891.

Doany, Fuad E., et al., "Dense 24 TX + 24 RX Fiber-Coupled Optical Module Based on a Holey CMOS Transceiver IC," IEEE Electronic Components and Technology Conference, (2010), 247.

Morozova, N.D., et al. "Controller Solder Self-alignment Sequence for an Optoelectronic Module without Mechanical Stops," IEEE Electronic Components and Technology Conference, (1997), 1188.

Eid, Feras, et al., U.S. Appl. No. 13/717,185, entitled "Optical Interconnect on Bumpless Build-up Layer Package," filed Dec. 17, 2012.

Aleksov, Aleksandar, et al., U.S. Appl. No. 13/725,356, entitled "Thermal Matched Composite Die," filed Dec. 21, 2012.

Chang, Peter L. D., et al., U.S. Appl. No. 13/722,951, entitled "An Electro-Optical Assembly Including a Glass Bridge," filed Dec. 20, 2012.

International Preliminary Report on Patentability Received for PCT Application No. PCT/US2011/061423, Mailed on May 30, 2014, 6 pages.

Office Action and Search Report mailed Feb. 19, 2016, issued in corresponding Taiwan Patent Application No. 101141798.

International Preliminary Report on Patentability mailed May 30, 2014, issued in corresponding International Application No. PCT/US2011/061423, 4 pages.

* cited by examiner

US 9,391,427 B2

THERMAL MANAGEMENT IN PACKAGED VCSELS

RELATED MATTERS

This application claims priority to PCT/US2011/061423, filed on Nov. 18, 2011.

BACKGROUND OF THE INVENTION

1. Field of the Invention

Embodiments of the invention relate generally to optical communication and data transfer in and around computing systems, vertical cavity surface emitting lasers (VCSELs), VCSEL array chips, VCSEL packaging, and thermal management of one or more VCSEL array chips.

2. Background Information

Data transmission and communication using optical-based technologies offers advantages over standard electrical conductor-based systems, such as higher rates of data transmission. For high rates of data transmission, data is encoded using one or more wavelengths of light, which can then be multiplexed together, sent to an input device, demultiplexed, and detected at a photodetector. Optical data transmission is useful, for example, inside and around personal computers, servers, supercomputers, and data centers as well as longer-range data transmission and communication activities. In optical data transmission applications between the components of a computing system, the components of the optical transmission system can be packaged for integration with IC (integrated circuit) chips, for example. As semiconductor chips trend toward higher performance and users desire smaller form factors, the packaging of the computing components must meet size, thermal management, power delivery, interconnect density, and integration challenges.

DETAILED DESCRIPTION OF THE INVENTION

The overheating of vertical cavity surface emitting laser (VCSEL) chips (or dies) in opto-electronic packages can degrade the VCSEL performance and affect the package reliability. In general a VCSEL is a semiconductor laser diode that emits electromagnetic radiation (in, for example, the 600 to 1000 nm wavelength range, although other values are possible) (which is referred to herein as "light") in a beam vertically from the surface of the chip (or die) on which it has been fabricated. The VCSEL chip can comprise one VCSEL or an array of VCSELs. Embodiments of the invention provide VCSEL chip package structures that provide thermal management for single or multiple VCSEL chips, and package structures comprising VCSEL chips and other components, such as integrated circuit (IC) chips. Thermal management systems for VCSEL chips described herein can be used as well in assemblies for other computing components in which data input/output functions are associated.

In optical data transmission systems employed between the components of a computing system, the components of the optical transmission system, such as VCSEL chips, can be mounted with other components of the computing system onto package substrates or boards (referred to herein, as package substrates). The package substrate supplies electrical connections (for example conducting lines and vias) that connect IC chips, power supplies, optical communication system components, and/or other electronic components. The package substrates can be, for example, printed circuit boards or microprocessor package substrates, although other substrates are possible. The package substrates typically comprise land, ball, or pin grid arrays.

Advantageously, embodiments of the invention provide thermal management of VCSEL chips using air cooling. Further, embodiments of the invention are capable of lowering the VCSEL chip operating temperatures to as low as 71 to 74° C. which, depending on the driving power used for the VCSEL chips, can be 16 to 24° C. less than the case where no such thermal solution is implemented.

Figure 1:
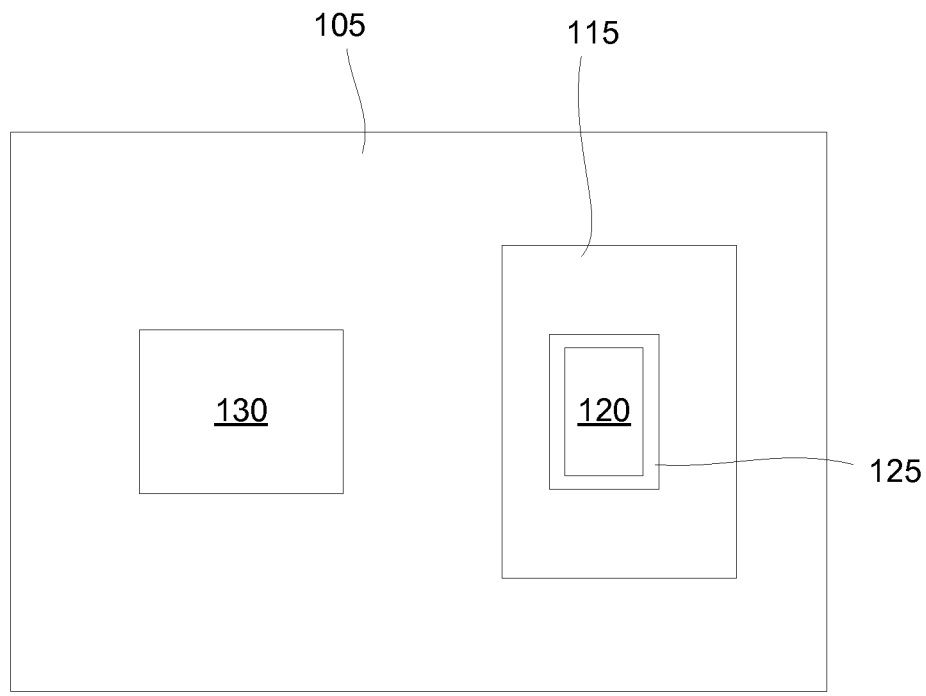
FIG. 1 is a schematic diagram illustrating a package assembly comprising a VCSEL chip and an associated thermal management system.

FIG. 1 illustrates a package assembly comprising a VCSEL chip and thermal management system for a VCSEL chip. In FIG. 1, a package substrate 105 houses a thermal frame 115 and VCSEL chip 120. The package substrate 105 illustrated in FIG. 1 can be a portion of a larger substrate that houses and electrically interconnects additional IC chips and/or other components of a computing system. The thermal frame 115 is thermally coupled to the VCSEL chip by a first thermal interface material 125 disposed between the thermal frame 115 and the VCSEL chip 120. In embodiments of the invention, the thermal frame 115 is comprised of a material that is capable of conducting heat such as silicon or a metal, such as aluminum or copper. The thermal interface material 125 is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicon or acrylic. The gap between the VCSEL chip 120 and the thermal frame 115 that is filled by the first thermal interface material 125 can vary in size, based in part, on the type of first thermal interface material 125 employed. Using a thermal interface material 125 having a high thermal conductivity allows the gap to be larger while still providing desired heat transfer away from the VCSEL chip 120 and into the thermal frame 115. In embodiments of the invention, the distance between VCSEL chip 120 and thermal frame 115 can be from 15 microns to 100 microns. The VCSEL chip 120 is electrically connected (and operably coupled) through the package substrate 105 to a transceiver 130. The VCSEL chip 120 can be, for example, flip-chip bonded to electrical interconnections (not shown) supplied by the package substrate. The transceiver 130 is typically an IC die that provides analog optical circuits, such as VCSEL chip drivers, and can integrate additional components, such as transimpedance amplifiers, and/or clock and data recovery circuits.

Figure 2:
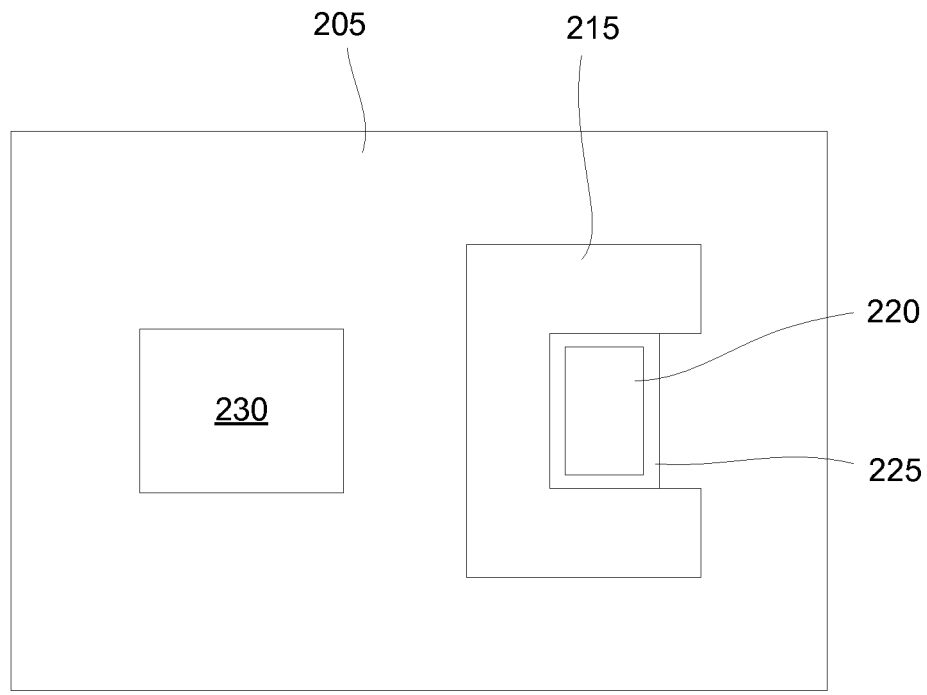
FIG. 2 is a schematic diagram illustrating an additional package assembly comprising a VCSEL chip and an associated thermal management system.

FIG. 2 illustrates an additional package assembly comprising a VCSEL chip and thermal management system for a VCSEL chip. In FIG. 2, a package substrate 205 houses a thermal frame 215 and VCSEL chip 220. The package substrate 205 illustrated in FIG. 2 can be a portion of a larger substrate that houses and electrically interconnects additional IC chips and/or other components of a computing system. The thermal frame 215 is thermally coupled to the VCSEL chip by a first thermal interface material 225 disposed between the thermal frame 215 and the VCSEL chip 220. In embodiments of the invention, the thermal frame 215 is comprised of a material that is capable of conducting heat such as silicon or a metal, such as aluminum or copper. The thermal interface material 225 is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicon or acrylic. The gap between the VCSEL chip 220 and the thermal frame 215 that is filled by the first thermal interface material 225 can vary in size, based in part, on the type of first thermal interface material 225 employed. Using a thermal interface material 225 having a high thermal conductivity allows the gap to be larger while still providing desired heat transfer away from the VCSEL chip 220 and into the thermal frame 215. In embodiments of the invention, the distance between VCSEL chip 220 and thermal frame 215 can be from 15 microns to 100 microns. The VCSEL chip 220 is electrically connected (and operably coupled) through the package substrate 205 to a transceiver 230. The VCSEL chip 220 can be, for example, flip-chip bonded to the electrical interconnections (not shown) of the package substrate. The transceiver 230 is typically an IC die that provides analog optical circuits, such as VCSEL chip drivers, and can integrate additional components, such as transimpedance amplifiers, and/or clock and data recovery circuits.

Figure 3:
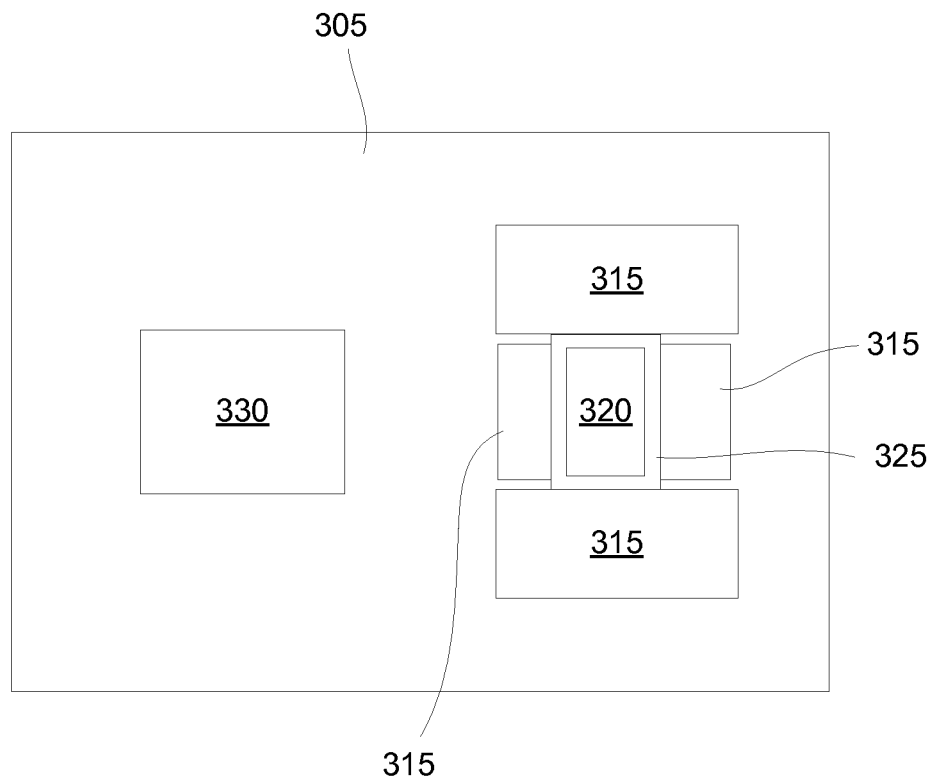
FIG. 3 is a schematic diagram illustrating a further package assembly comprising a VCSEL chip and an associated thermal management system.

FIG. 3 illustrates an additional package assembly comprising a VCSEL chip and thermal management system for a VCSEL chip. In FIG. 3, a package substrate 305 houses a thermal frame 315 and VCSEL chip 320. The package substrate 305 illustrated in FIG. 3 can be a portion of a larger substrate that houses and electrically interconnects additional IC chips and/or other components of a computing system. In FIG. 3, the thermal frame 315 is a multi-component frame. The thermal frame 315 is thermally coupled to the VCSEL chip by a first thermal interface material 325 disposed between the thermal frame 315 and the VCSEL chip 320. In embodiments of the invention, the thermal frame 315 is comprised of a material that is capable of conducting heat such as silicon or a metal, such as aluminum or copper. The thermal interface material 325 is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicon or acrylic. The gap between the VCSEL chip 320 and the thermal frame 315 that is filled by the first thermal interface material 325 can vary in size, based in part, on the type of first thermal interface material 325 employed. Using a thermal interface material 325 having a high thermal conductivity allows the gap to be larger while still providing desired heat transfer away from the VCSEL chip 320 and into the thermal frame 315. In embodiments of the invention, the distance between VCSEL chip 320 and thermal frame 315 can be from 15 microns to 100 microns. The VCSEL chip 320 is electrically connected (and operably coupled) through the package substrate 305 to a transceiver 330. The VCSEL chip 320 can be, for example, flip-chip bonded to the electrical interconnections (not shown) of the package substrate. The transceiver 330 is typically an IC die that provides analog optical circuits, such as VCSEL chip drivers, and can integrate additional components, such as transimpedance amplifiers, and/or clock and data recovery circuits.

Figure 4A:
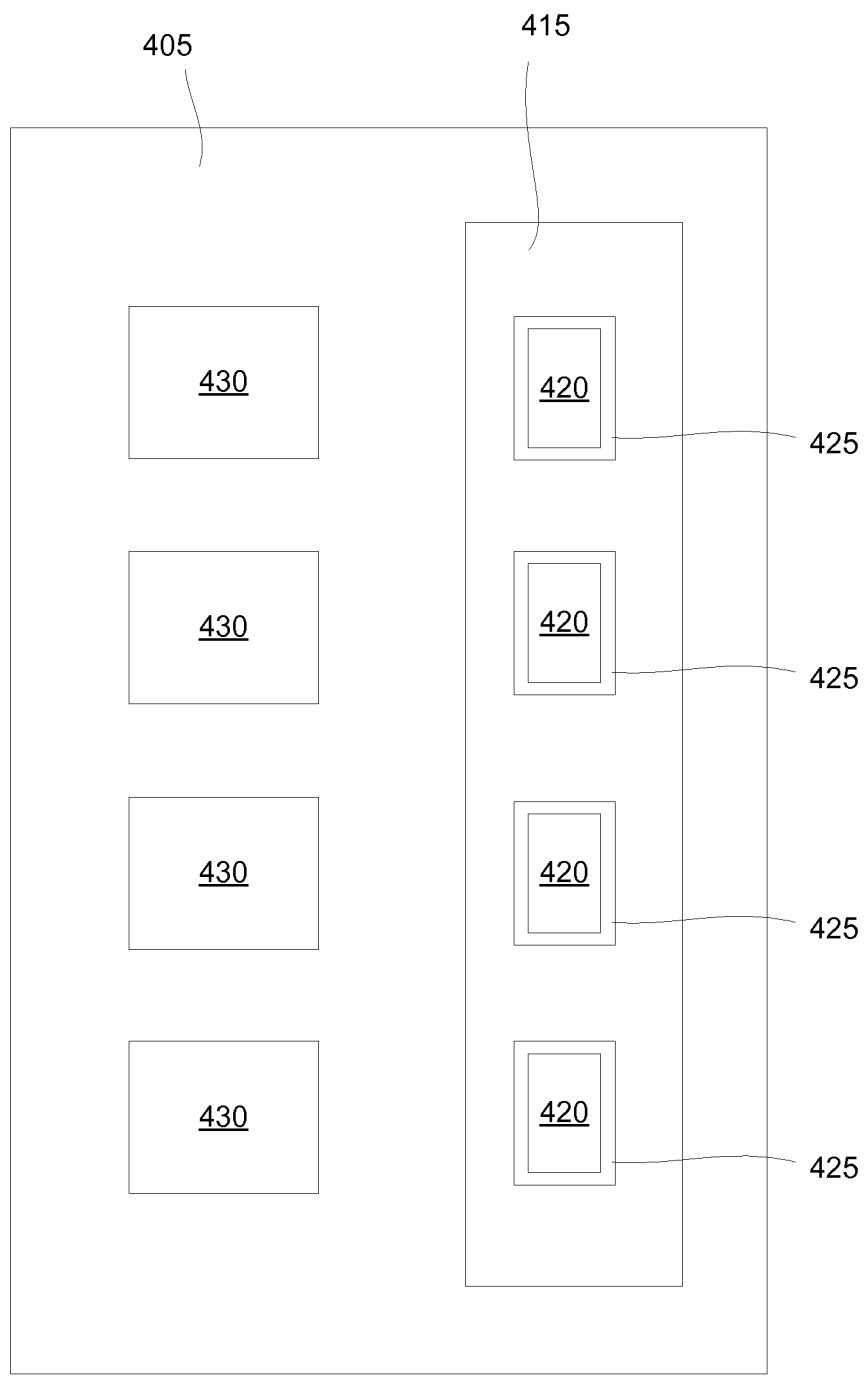
FIGS. 4A-C illustrate package assemblies comprising multiple VCSEL chips and an associated thermal management system.
Figure 4B:
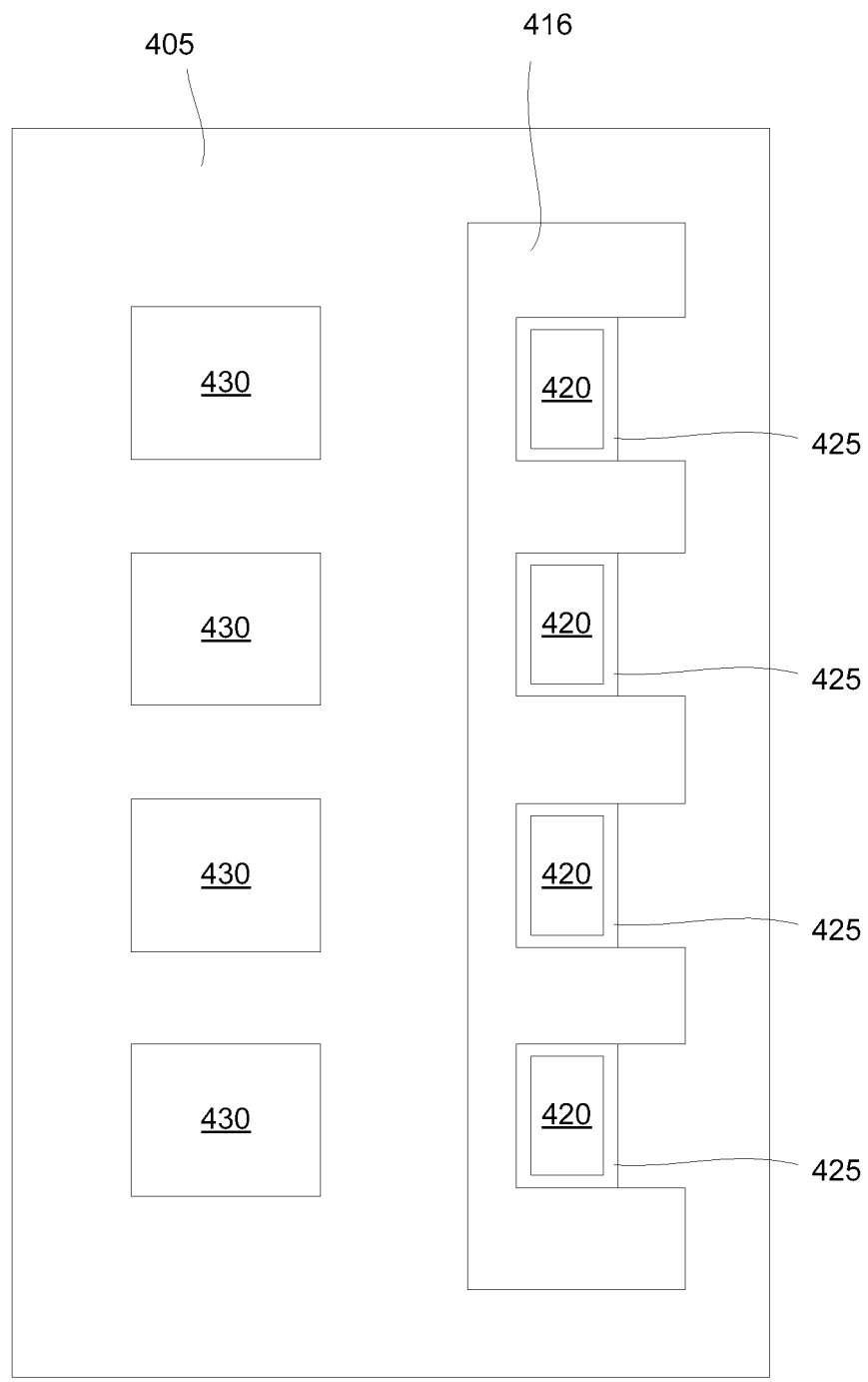
Figure 4C:
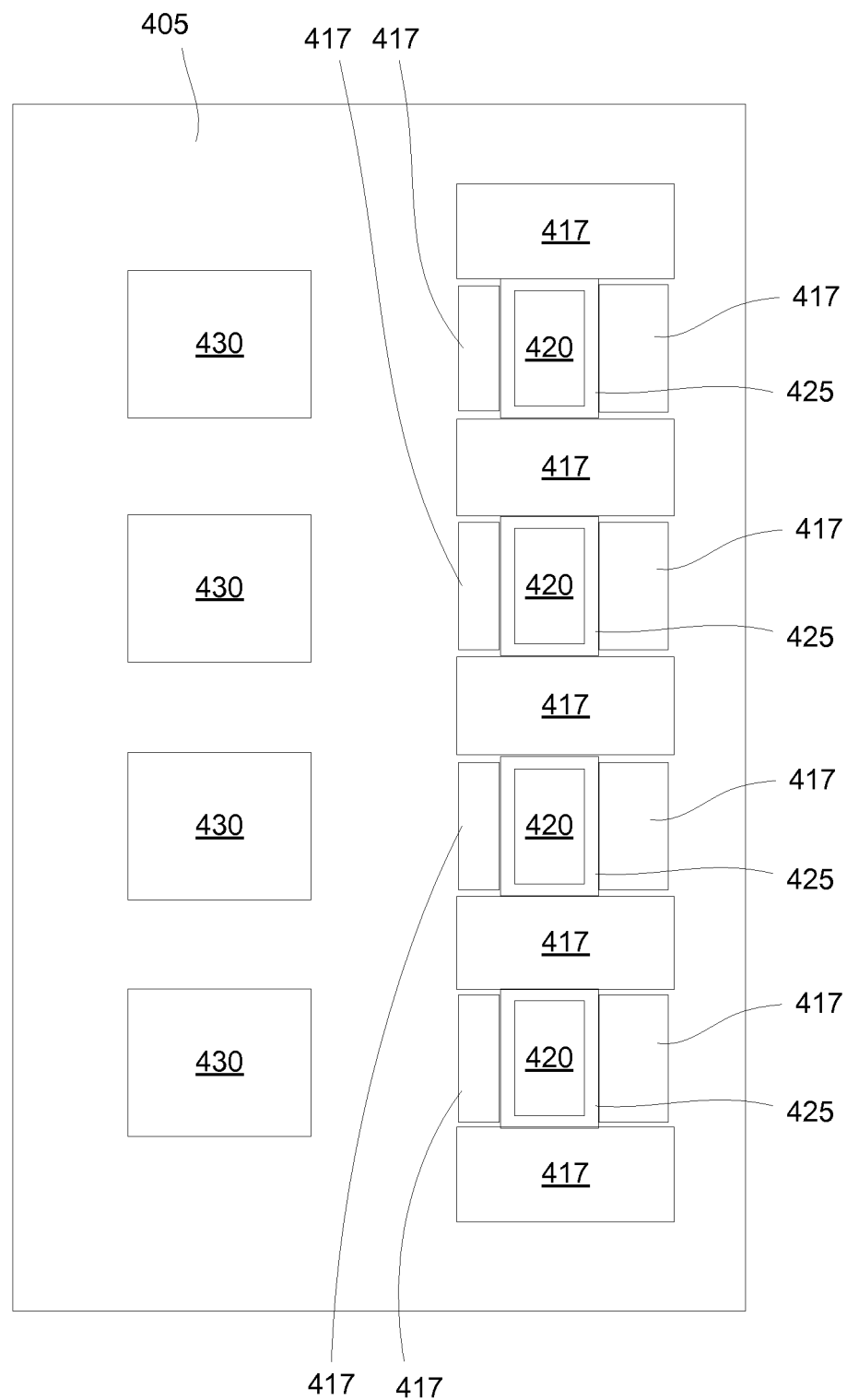

FIGS. 4A-C illustrate package assemblies having multiple VCSEL chips and a VCSEL chip thermal management system. FIG. 4A has a thermal management system that is similar in design to that of FIG. 1 however now the thermal management system is associated with a plurality of VCSEL chips. In FIGS. 4A-C, a package substrate 405 houses thermal frames 415, 416, and 417 and a plurality of VCSEL chips 420. The package substrate 405 illustrated in FIGS. 4A-C can be a portion of a larger substrate that houses and electrically interconnects additional IC chips and/or other components of a computing system. In FIG. 4C, the thermal frame 417 is a multi-component frame. Each of the thermal frames 415, 416, and 417 is thermally coupled to the VCSEL chips 420 by a first thermal interface material 425 disposed between the thermal frame and the VCSEL chips 420. The gap between the VCSEL chips 420 and thermal frames 415, 416, and 417 that is filled by the first thermal interlace material 425 can vary in size, based in part, on the type of first thermal interface material 425 employed. Using a thermal interface material 425 having a high thermal conductivity allows the gap to be larger while still providing desired heat transfer away from the VCSEL chips 420 and into the thermal frame 415, 416, or 417. In embodiments of the invention, the distance between VCSEL chip 420 and thermal frames 415, 416, and 417 can be from 15 microns to 100 microns. In embodiments of the invention, the thermal frames 415, 416, and 417 are comprised of a material that is capable of conducting heat such as silicon or a metal, such as aluminum or copper. The thermal interface material 425 is a material that is capable of conducting heat, such as, for example, a phase change material, a ceramic-polymer composite, a metal-polymer composite, or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicon or acrylic. In embodiments of the invention, the distance between VCSEL chip 420 and thermal frame 415, 416, or 417 can be from 15 microns to 100 microns. The VCSEL chips 420 are each electrically connected (and operably coupled) through the package substrate 405 to a transceiver 430. The VCSEL chips 420 can be, for example, flip-chip bonded to the electrical interconnections (not shown) of the package substrate. The transceivers 430 are typically an IC die that provides analog optical circuits, such as VCSEL chip drivers, and can integrate additional components, such as transimpedance amplifiers, and/or clock and data recovery circuits. In alternate embodiments some or all of the VCSEL chips 425 can be photodetectors, such as, for example, photodiode chips, avalanche photodiode (APD) chips, and separate absorption charge multiplication APD chips. A photodiode is electrically coupled to a transceiver 430. Although four VCSELs (and/or photodetectors) are shown in the configurations in FIGS. 4A-C, other numbers of VCSEL chips (and/or photodetectors) are possible, such as two, three, five, etc.

Figure 5A:
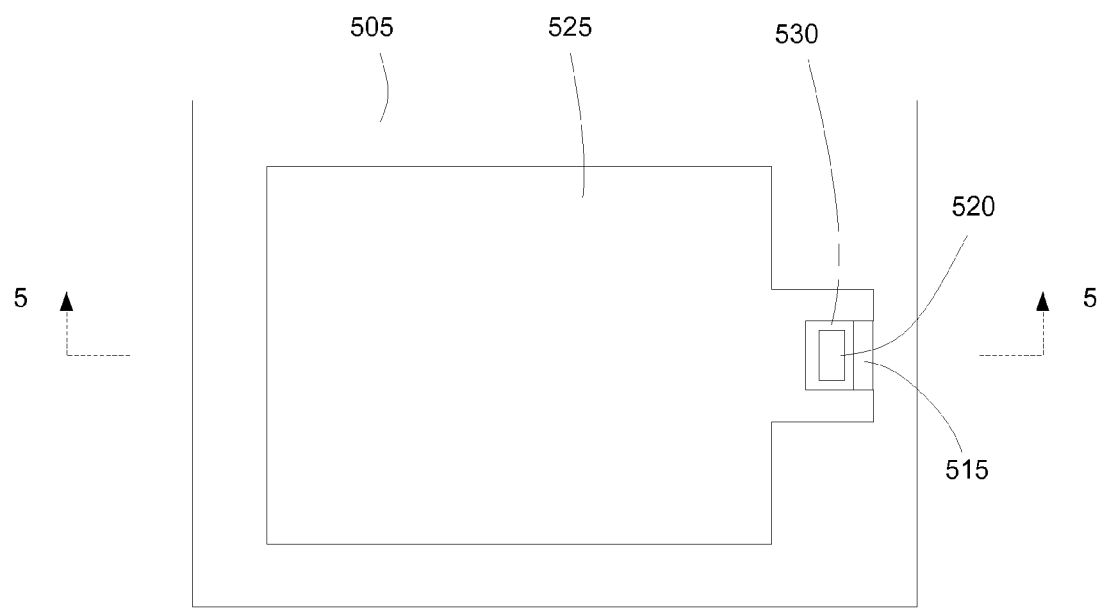
FIGS. 5A-B illustrate a package assembly comprising a VCSEL chip, IC chips, and an associated thermal management system.
Figure 5B:
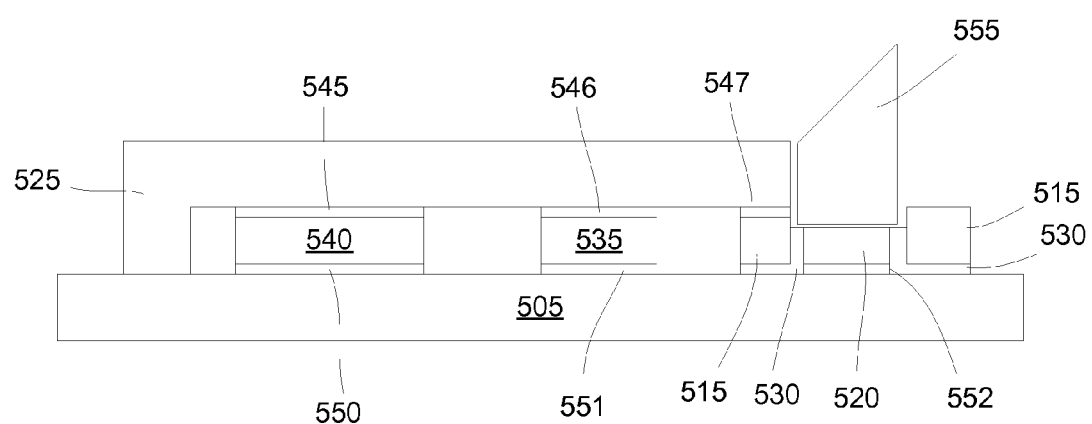

FIGS. 5A-B illustrate further views of a package assembly having a VCSEL chip and a VCSEL chip thermal management system. In FIG. 5A, a package substrate 505 houses thermal frame 515 and VCSEL chip 520 which are thermally coupled by a first thermal interface material 530 disposed between the thermal frame 515 and the VCSEL chip 520. The thermal frame 515 can be, for example, any of the thermal frames described with respect to FIGS. 1-4. The package assembly of FIGS. 5A-B can be configured for multiple VCSEL chips and/or photodetector chips. A heat spreader 525 makes thermal contact with the thermal frame 515. The heat spreader 525 is comprised, for example, of a thermally conductive material, such as a metal, such as copper or aluminum. FIG. 5B is a view along 5-5 of FIG. 5A. In FIG. 5B, substrate 505 houses thermal frame 515 and VCSEL chip 520. The thermal frame 515 is thermally coupled to the VCSEL chips 520 by a first thermal interface material 530 disposed between the thermal frame 515 and the VCSEL chips 520. In embodiments of the invention, the thermal frames 515 is comprised of a material that is capable of conducting heat such as silicon or a metal, such as aluminum or copper. The thermal interface material 530 is a material that is capable of conducting heat, such as for example, a phase change material, a ceramic-polymer composite, a metal-polymer composite, or a graphite-polymer composite, where a polymer can be a grease, a gel, an elastomer, or a thermosetting plastic. Examples of thermal, interface materials include elastomers, greases, and gels comprising silver filler particles, graphite filled silicone or acrylic, ceramic particle filled silicon or acrylic. The VCSEL chip 520 is electrically connected (and operably coupled) through the substrate 505 to a transceiver 535. The VCSEL chip 520 can be, for example, flip-chip bonded to the electrical interconnections (not shown) of the substrate 505. The transceiver 535 is typically an IC die that provides analog optical circuits, such as VCSEL chip drivers, and can integrate additional components, such as transimpedance amplifiers, and/or clock and data recovery circuits. In embodiments of the invention, an IC device 540 is a semiconductor device or a plurality of semiconductor devices that are packaged together (such as in a three dimensional package assembly although, other configurations are also possible), such as, a processor (single core or multicore), a logic chip, a graphics chip, a memory chip, a memory controller hub, an I/O (input/output) controller hub, and/or a MEMS (micro-electro-mechanical system) devices, and the IC device 540 is operably coupled to the transceiver 535 and capable of outputting data optically through VCSEL 520. In embodiments of the invention, the substrate 505 additionally comprises one or more photodetectors (not shown) operably coupled to transceivers (not shown) which are operably coupled to IC device 540 and capable of receiving data for input into the IC device 540. Regions 550, 551, and 552 comprise interconnects between the semiconductor device 540, 535, or 520, respectively, and the substrate 505 and an optional underfill material. Interconnections can be formed between, for example, bumps, pads, pillars, and or pins associated with the semiconductor device 520, 535, or 540 and the substrate 505 and can optionally comprise solder. A second thermal interface material 545 thermally couples the IC chip 540, the transceiver 535, and the thermal frame 515 to the heat spreader 525. The second thermal interface materials 545, 546, and 547 are the same or different materials and are a material that is capable of conducting heat such as, for example, a phase change material, a ceramic-polymer composite, a metal-polymer composite, and/or a graphite-polymer composite, where a polymer can be a grease, a gel, an elastomer, or a thermosetting plastic. Examples of thermal interface materials include elastomers, greases, and gels comprising silver filler particles, graphite filled silicone or acrylic, ceramic particle filled silicon or acrylic. The VCSEL chip emits light vertically along the z axis (FIG. 5B) and in a direction that is away from the substrate 505. In embodiments of the invention, an optical coupler 555 (not shown in FIG. 5A for clarity of illustration) is capable of receiving the light output from the VCSEL chip 520 and directing it into one or more waveguides and/or optical fibers (not shown), that connect to other elements of, for example, a computing system in which the package structure of FIGS. 5A-B is housed. The optical coupler 555 is part of a routing system (not shown) that is capable of routing light from VCSEL chip 520 to one or more photodetectors which are operably coupled to, for example, other IC chips that make up a computing system. The optical coupler 555 is capable of receiving light from the VCSEL chip 520 and directing it into one or more waveguides and/or optical fibers. Optical couplers associated with photodetectors are capable of directing light from one or more waveguides and/or optical fibers onto the detection surface of a photodetector.

If made of silicon, the thermal frames as described herein can be assembled in a manner that is similar to the attachment of other IC die to the package substrate. The thermal frame can be provided, for example, with non-functional solder bumps (i.e., solder bumps that do not provide electrical connections) on the thermal frame and these can be bonded to corresponding bumps on the package substrate, using standard assembly processes and equipment. If comprised of metal, the frame can be assembled separately, using for example, a die attach film or an adhesive to fasten it to the package substrate. In alternate embodiments, the thermal frame can be combined with the integrated heat spreader. The thermal frame can be formed with and as part of the integrated heat spreader, by, for example, stamping or machining. In the embodiment in which the thermal frame is formed integrally with the integrated heat spreader 525, a thermal interface material 545 between the thermal frame and the integrated heat spreader 525 can be omitted.

In general the VCSEL chip can comprise an array of VCSELs, such as a 1×4, 1×12, 2×2, or 4×2 (and so on) array. Embodiments of the invention are not limited to a particular type of VCSEL, VCSEL chip, or VCSEL chip array.

The VCSEL chip thermal management systems described herein are useful, for example, in computing and data transfer applications. The VCSEL chip thermal management systems are useful in optical interconnects and package-to-package optical interconnects in supercomputers and other high performance computing applications, blade servers, data centers, as well as desktop and laptop computers, cell phones, net books, and smartphones, but are not limited to these applications. In supercomputers and blade servers, for example, high speed I/O is necessary between the multiple processors, in blade servers between the blades of the server, and in other computing systems, for example, between processors and chipsets. Optical transmission is especially valuable as compared to electrical over longer transmission lengths, such as, between the blades of a blade server. Other uses for VCSEL thermal management systems according to embodiments of the invention include, for example, data transfer between routers in a super computer and between CPUs in a multiprocessor system.

Figure 6:
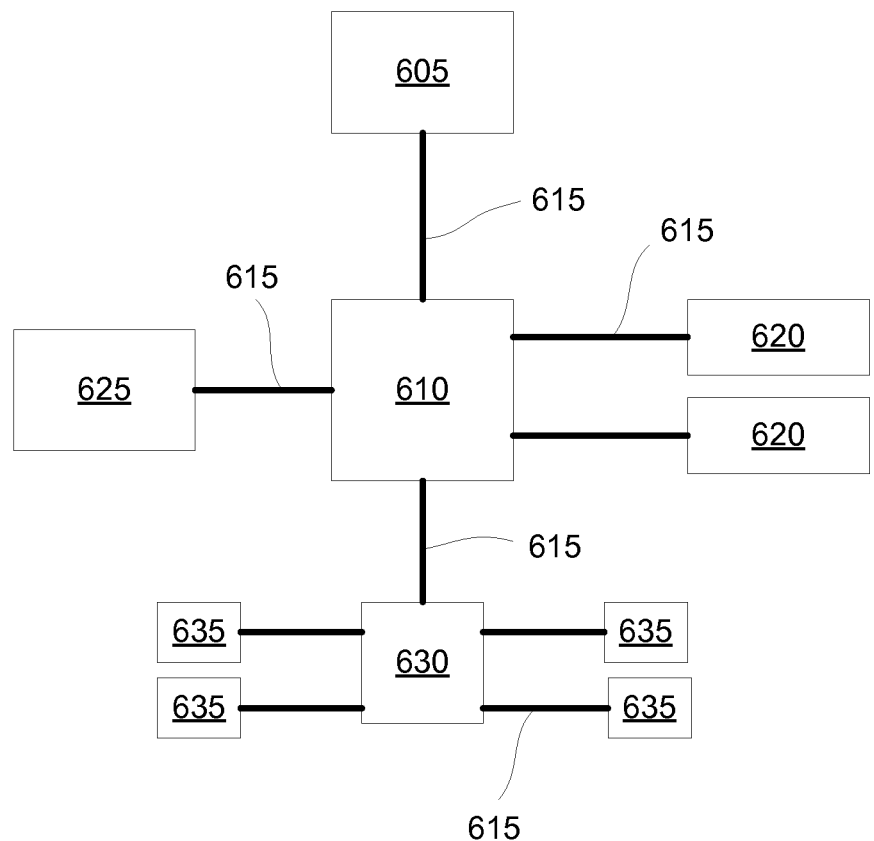
FIG. 6 diagrams a computing system in which VCSEL chips and associated VCSEL thermal management systems are employed.

FIG. 6 provides an exemplary computing system employing light from VCSEL chips for data transfer and associated thermal management systems. In FIG. 6, a computing system comprises a processor 605 connected to a memory controller hub 610 through an (optional) optical interconnection 615. The optical interconnections 615 (the details of which are not shown for clarity of illustration) comprise at least one VCSEL chip and associated VCSEL chip thermal management system according to embodiments of the invention, an optical coupler optically coupled to the VCSEL chip, a photodetector, an optical coupler optically coupled to the photodetector, and at least one waveguide optically coupled to and capable of guiding light between the optical couplers. The VCSEL chip is capable of receiving data from the output IC chip and the photodetector is capable of sending data to the input IC chip. A two-way I/O communication system comprises at least one VCSEL chip and at least one photodetector associated with a first IC chip, such as a processor, and at least one VCSEL chip and at least one photodetector associated with a second IC chip. The VCSEL associated with the first IC chip is optically coupled to the photodetector associated with the second IC chip, and the VCSEL chip associated with the second IC chip is optically coupled to the photodetector associated with the first IC chip. In embodiments of the invention, the optical interconnects 615 are a two-way link and/or a plurality of optical connections associated, for example, with a plurality of VCSEL chips and an plurality of corresponding photodetectors. In the computing system of FIG. 6, the memory controller hub 610 is coupled to memory chips 620 through an (optional) optical interconnect 615, to a graphics chip 625 through an (optional) optical interconnect 615, and to an input/output controller chip 630 through an (optional) optical interconnect 615. The input/output controller chip 630 is connected to input/output devices 635 through (optional) optical interconnection 615. In alternate embodiments of the invention, one or more of the optical interconnections 615 are electrical interconnections and one or more elements of the computing system (e.g., 605, 610, 625, 620, 630, and/or 635) are coupled through electrical interconnects. Input/output devices 635 include, for example, USB (universal serial bus), USB2, SATA (serial advanced technology attachment), audio, PCI (peripheral component interconnect), and PCI express devices. In alternate embodiments some or all of the components of the computing system of FIG. 6 are coupled electrically and data input/output is supplied through electrical interconnections. Other configurations and elements are, of course, possible for a computing system.

Typically a computer, a portable computing device, or other device comprising a processor, has a processing system, including one or more processors that are communicatively coupled to one or more volatile or non-volatile data storage devices, such as random access memory (RAM), read-only memory (ROM), mass storage devices such as serial advanced technology attachment (SATA) or small computer system interface (SCSI) hard drives, and/or devices capable of accessing media, such as floppy disks, optical storage, tapes, flash memory, memory sticks, CD-ROMs and/or digital video disks (DVDs). One or more of these elements of the computer can be communicatively coupled through an optical interconnection employing VCSELs and associated VCSEL thermal management systems as described herein. The term ROM refers to non-volatile memory devices such as erasable programmable ROM (EPROM), electrically erasable programmable ROM (EEPROM), flash ROM, and/or flash memory. The processor may also be communicatively coupled to additional components, such as video controllers, SCSI controllers, network controllers, universal serial bus (USB) controllers, and input devices. Some or all of the communications between elements of the computer system, additional processors, and/or the electrical usage monitors can also occur using various wired and/or wireless short range protocols including, USB, WLAN (wireless local area network), radio frequency (RF), satellite, microwave, Institute of Electrical and Electronics Engineers (IEEE) 802.11, Bluetooth, optical, fiber optical, infrared, cables, and lasers.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics disclosed in the embodiments may be combined in any suitable manner in one or more embodiments. Various additional layers and/or structures may be included and/or described features may be omitted in other embodiments.

We claim:

1. A device comprising:
   a package substrate having a surface,
   a vertical cavity surface emitting laser chip disposed on the substrate surface and electrically interconnected with the package substrate,
   a thermal frame that comprises a multi-component frame, and is disposed on the package substrate surface and proximate to at least three sides of the vertical cavity surface emitting laser chip, wherein the at least three sides of the vertical cavity surface emitting laser chip include a first side, a second side perpendicular to the first side, and a third side perpendicular to the second side and opposite the first side, wherein the vertical cavity surface emitting laser chip further includes a fourth side perpendicular to the first and third sides and opposite the second side, wherein the thermal frame includes at least three separated frame components corresponding to, and proximate to, the first, second and third sides of the vertical cavity surface emitting laser chip respectively, wherein the first and third frame components extend in perpendicular direction beyond the fourth side of the vertical cavity surface emitting laser chip; and
   a thermal interface material disposed between the at least three sides of the vertical cavity surface emitting laser chip and the at least three thermal frame components, as well as between the thermal frame components, wherein the thermal interface material is capable of thermally coupling the vertical cavity surface emitting laser chip to the thermal frame.

2. The device of claim 1 wherein the thermal frame components are comprised of silicon.

3. The device of claim 1 wherein the thermal frame components are comprised of silicon and are bonded to the package substrate through solder bumps.

4. The device of claim 1 wherein the thermal frame components are comprised of a metal and are bonded to the package substrate with an adhesive.

5. The device of claim 1 wherein the thermal frame components are comprised of a metal selected from a group consisting of copper and aluminum.

6. The device of claim 1 also including a transceiver chip electrically coupled to the package substrate wherein the package substrate electrically couples the transceiver chip to the vertical cavity surface emitting laser chip and wherein the transceiver chip is capable of driving the vertical cavity surface emitting laser chip.

7. The device of claim 1 also including an integrated heat spreader thermally coupled to the thermal frame.

8. The device of claim 1 also including an integrated heat spreader thermally coupled to the thermal frame wherein the thermal coupling is through a thermal interface material.

9. The device of claim 1 wherein the vertical cavity surface emitting laser chip is capable of emitting light from a side that is opposite the side that is connected to the package substrate.

10. The device of claim 1 wherein the vertical cavity surface emitting laser chip comprises an array of vertical cavity surface emitting lasers.

11. The device of claim 1 wherein the thermal frame components are disposed on four sides of the vertical cavity surface emitting laser chip, wherein the thermal frame further includes a fourth component disposed proximate to the fourth side of the vertical cavity surface emitting laser chip.

12. A device comprising:
a package substrate having a surface;
a plurality of vertical cavity surface emitting laser chips disposed on the substrate surface and electrically interconnected with the package substrate;
a thermal frame that comprises a multi-component frame, wherein a thermal frame is disposed on the package substrate surface and proximate to at least three sides of a respective one of the plurality of vertical cavity surface emitting laser chips, wherein the at least three sides of a vertical cavity surface emitting laser chip include a first side, a second side perpendicular to the first side, and a third side perpendicular to the second side and opposite the first side, wherein the vertical cavity surface emitting laser chip further includes a fourth side perpendicular to the first and third sides and opposite the second side, wherein the thermal frame includes at least three separated frame components corresponding to, and proximate to, the first, second and third sides of the vertical cavity surface emitting laser chip respectively, wherein the first and third frame components extend in perpendicular direction beyond the fourth side of the vertical cavity surface emitting laser chip; and
a thermal interface material disposed between the at least three sides of the vertical cavity surface emitting laser chip and the at least three thermal frame components, as well as between the thermal frame components, wherein the thermal interface material is capable of thermally coupling the vertical cavity surface emitting laser chip to the thermal frame;
a plurality of transceiver chips electrically coupled to respective ones of the plurality of vertical cavity surface emitting laser chips through the package substrate and capable of driving the vertical cavity surface emitting laser chips; and
a plurality of integrated circuit (IC) chips electrically coupled to respective transceiver chips wherein output from an IC chip is capable of being electrically communicated through a respective transceiver chip to a respective one of the vertical cavity surface emitting laser chips.

13. The device of claim 12 wherein the thermal frame components are comprised of silicon.

14. The device of claim 12 wherein the thermal frame components are comprised of silicon and are bonded to the package substrate through solder bumps.

15. The device of claim 12 wherein the thermal frame components are comprised of a metal and are bonded to the package substrate with an adhesive.

16. The device of claim 12 wherein the thermal frame components are comprised of a metal selected from a group consisting of copper and aluminum.

17. The device of claim 12 also including an integrated heat spreader thermally coupled to the thermal frame.

18. The device of claim 12 also including an integrated heat spreader thermally coupled to a respective thermal frame, a transceiver chip, and an IC chip.

19. The device of claim 18 wherein the thermal coupling is through a thermal interface material.

20. The device of claim 12 wherein each of the vertical cavity surface emitting laser chips is capable of emitting light from a side that is opposite the side that is connected to the package substrate.

21. The device of claim 12 wherein one or more of the vertical cavity surface emitting laser chip comprises an array of vertical cavity surface emitting lasers.

22. The device of claim 12 wherein the thermal frame components are disposed on four sides of the vertical cavity surface emitting laser chip, wherein the thermal frame further includes a fourth component disposed proximate to the fourth side of the vertical cavity surface emitting laser chip.

* * * * *